(12) United States Patent
Gilliland

(10) Patent No.: US 7,408,778 B2
(45) Date of Patent: Aug. 5, 2008

(54) HEAT SINKS FOR DISSIPATING A THERMAL LOAD

(75) Inventor: Don A. Gilliland, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 39 days.

(21) Appl. No.: 11/530,546

(22) Filed: Sep. 11, 2006

(65) Prior Publication Data

US 2008/0062648 A1 Mar. 13, 2008

(51) Int. Cl.
H05K 7/20 (2006.01)
(52) U.S. Cl. .................. 361/704; 361/699; 165/80.3; 165/80.4
(58) Field of Classification Search ............ None
See application file for complete search history.

(56) References Cited

U.S. PATENT DOCUMENTS

| | | | |
|---|---|---|---|
| 3,654,528 A * | 4/1972 | Barkan ................ 257/714 |
| 4,366,857 A * | 1/1983 | Mayer ............... 165/104.23 |
| 4,579,167 A * | 4/1986 | Kuznetsov ............ 164/463 |
| 4,635,705 A * | 1/1987 | Kuznetsov ............ 164/466 |
| 5,462,685 A * | 10/1995 | Raj et al. ............ 252/62.56 |
| 5,763,951 A * | 6/1998 | Hamilton et al. ......... 257/714 |
| 5,841,634 A * | 11/1998 | Visser ................. 361/699 |
| 6,397,931 B1 * | 6/2002 | Lin et al. .............. 165/80.3 |
| 6,410,982 B1 * | 6/2002 | Brownell et al. ......... 257/714 |
| 6,588,498 B1 * | 7/2003 | Reyzin et al. ........ 165/104.33 |
| 6,658,861 B1 * | 12/2003 | Ghoshal et al. ........... 62/3.7 |
| 6,708,501 B1 * | 3/2004 | Ghoshal et al. ........... 62/3.7 |
| 6,719,039 B2 * | 4/2004 | Calaman et al. ......... 165/80.4 |
| 6,785,134 B2 * | 8/2004 | Maveety et al. .......... 361/699 |
| 7,031,160 B2 * | 4/2006 | Tillotson .............. 361/704 |
| 7,040,383 B2 * | 5/2006 | Oyamada ............. 165/104.33 |
| 2005/0117300 A1 * | 6/2005 | Prasher et al. .......... 361/699 |
| 2006/0133039 A1 * | 6/2006 | Belady ................ 361/699 |
| 2007/0230128 A1 * | 10/2007 | Kim et al. ............. 361/699 |

* cited by examiner

Primary Examiner—Boris L Chervinsky
(74) Attorney, Agent, or Firm—Biggers & Obanian LLP

(57) ABSTRACT

Heat sinks for dissipating a thermal load are disclosed that include: a heat sink base capable of receiving a thermal load from a thermal source; heat-dissipating fins mounted on the heat sink base, each heat-dissipating fin enclosing a hollowed cavity inside the heat-dissipating fin; and a thermal transport within the hollowed cavity of each heat-dissipating fin, the thermal transport capable of convectively transferring the thermal load along a convective heat path within each heat-dissipating fin. Heat sinks for dissipating a thermal load may also include: a pair of electrodes inside each heat-dissipating fin electrically connected to the thermal transport for generating an electric current through the thermal transport; and a magnet mounted adjacent to the heat-dissipating fins for generating a magnetic field through the thermal transport, the magnetic field passing through the electric current and oriented to induce a force on the thermal transport along the convective heat path.

10 Claims, 5 Drawing Sheets

```
┌─────────────────────────────────────────────────────────────┐
│ Receive, In A Heat Sink Base, A Thermal Load From A Thermal │
│ Source                                                      │
│ 300                                                         │
└─────────────────────────────────────────────────────────────┘

┌─────────────────────────────────────────────────────────────┐
│ Transfer The Thermal Load To Heat-Dissipating Fins Mounted  │
│ On The Heat Sink Base Through A Conductive Heat Path  302   │
│ ┌─────────────────────────────────────────────────────────┐ │
│ │ Transfer The Thermal Load Into A Thermal Transport In A │ │
│ │ Hollowed Cavity Enclosed Within Each Heat-dissipating   │ │
│ │ Fin  304                                                │ │
│ └─────────────────────────────────────────────────────────┘ │
└─────────────────────────────────────────────────────────────┘
                              │
                              ▼
┌─────────────────────────────────────────────────────────────┐
│ Transfer The Thermal Load Along A Convective Heat Path      │
│ Enclosed Within Each Heat-dissipating Fin To Distribute The │
│ Thermal Load  306                                           │
│ ┌─────────────────────────────────────────────────────────┐ │
│ │ Generate, By A Pair Of Electrodes Inside Each Heat-     │ │
│ │ Dissipating Fin, An Electric Current Through The        │ │
│ │ Thermal Transport Within Each Heat-Dissipating Fin  308 │ │
│ └─────────────────────────────────────────────────────────┘ │
│ ┌─────────────────────────────────────────────────────────┐ │
│ │ Generate, By A Magnet Mounted Adjacent To The Heat-     │ │
│ │ dissipating Fins, A Magnetic Field Through The Thermal  │ │
│ │ Transport Within Each Heat-Dissipating Fin, The         │ │
│ │ Magnetic Field Passing Through The Electric Current And │ │
│ │ Oriented To Induce A Force On The Thermal Transport     │ │
│ │ Along The Convective Heat Path  310                     │ │
│ └─────────────────────────────────────────────────────────┘ │
│ ┌─────────────────────────────────────────────────────────┐ │
│ │ Reduce Magnetic Reluctance Between Each Of The Heat-    │ │
│ │ Dissipating Fins By Placing Ferromagnetic Material      │ │
│ │ Between Each Of The Heat-Dissipating Fins  312          │ │
│ └─────────────────────────────────────────────────────────┘ │
└─────────────────────────────────────────────────────────────┘
                              │
                              ▼
┌─────────────────────────────────────────────────────────────┐
│ Adjust The Force On The Thermal Transport Within Each Heat- │
│ Dissipating Fin  314                                        │
│ ┌─────────────────────────────────────────────────────────┐ │
│ │ Adjust The Electric Current Generated By The Pair Of    │ │
│ │ Electrodes  316                                         │ │
│ └─────────────────────────────────────────────────────────┘ │
│ ┌─────────────────────────────────────────────────────────┐ │
│ │ Adjust The Magnetic Field Generated By The Magnet  318  │ │
│ └─────────────────────────────────────────────────────────┘ │
└─────────────────────────────────────────────────────────────┘
```

FIG. 4

HEAT SINKS FOR DISSIPATING A THERMAL LOAD

BACKGROUND OF THE INVENTION

1. Field of the Invention

The field of the invention is heat sinks for dissipating a thermal load and methods dissipating a thermal load.

2. Description of Related Art

The development of the EDVAC computer system of 1948 is often cited as the beginning of the computer era. Since that time, users have relied on computer systems to simplify the process of information management. Today's computer systems are much more sophisticated than early systems such as the EDVAC. Such modern computer systems deliver powerful computing resources to provide a wide range of information management capabilities through the use of computer software such as database management systems, word processors, spreadsheets, client/server applications, web services, and so on.

In order to deliver powerful computing resources, computer architects must design powerful computer processors and high-speed memory modules. Current computer processors, for example, are capable of executing billions of computer program instructions per second. Operating these computer processors and memory modules requires a significant amount of power. Often processors can consume over 100 watts during operation. Consuming significant amounts of power generates a considerable amount of heat. Unless the heat is removed, the heat generated by a computer processor or memory module may degrade or destroy the component's functionality.

To prevent the degradation or destruction of an electronic component, a computer architect may remove heat from the electronic component by using traditional heat sinks. Traditional heat sinks typically have fins for dissipating heat into the environment surrounding the heat sink. Traditional heat sinks absorb the heat from an electronic component and transfer the heat throughout the heat-dissipating fins using thermal conduction. The thermal resistivity of the materials used to design the fins in traditional heat sinks, however, often results in an uneven distribution of heat throughout the fins when distribution occurs conductively. Such uneven distribution of heat throughout the fins typically reduces the overall efficiency of the fins to dissipate heat. As such, readers will appreciate that room for improvement exists with regard to increases the efficiency of traditional heat sinks.

SUMMARY OF THE INVENTION

Heat sinks for dissipating a thermal load are disclosed that include: a heat sink base capable of receiving a thermal load from a thermal source heat-dissipating fins mounted on the heat sink base, each heat-dissipating fin enclosing a hollowed cavity inside the heat-dissipating fin; and a thermal transport within the hollowed cavity of each heat-dissipating fin, the thermal transport capable of convectively transferring the thermal load along a convective heat path within each heat-dissipating fin.

In addition, heat sinks for dissipating a thermal load may also include: a pair of electrodes inside each heat-dissipating fin, the pair of electrodes electrically connected to the thermal transport within each heat-dissipating fin for generating an electric current through the thermal transport; and a magnet mounted adjacent to the heat-dissipating fins for generating a magnetic field through the thermal transport within each heat-dissipating fin, the magnetic field passing through the electric current and oriented to induce a force on the thermal transport along the convective heat path.

Methods for dissipating a thermal load are disclosed that include: receiving, in a heat sink base, a thermal load from a thermal source; transferring the thermal load to heat-dissipating fins mounted on the heat sink base through a conductive heat path; and transferring the thermal load along a convective heat path enclosed within each heat-dissipating fin to distribute the thermal load.

Methods for dissipating a thermal load are disclosed that include: providing a thermal transport in a hollowed cavity enclosed within a heat-dissipating fin, the heat-dissipating fin mounted to a heat sink base that receives a thermal load from a thermal source; and circulating the thermal transport along a convective heat path within the heat-dissipating fin.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 4 sets forth a flow chart illustrating an exemplary method for dissipation of a thermal load according to embodiments of the present invention.

DETAILED DESCRIPTION OF EXEMPLARY EMBODIMENTS

Figure 1:
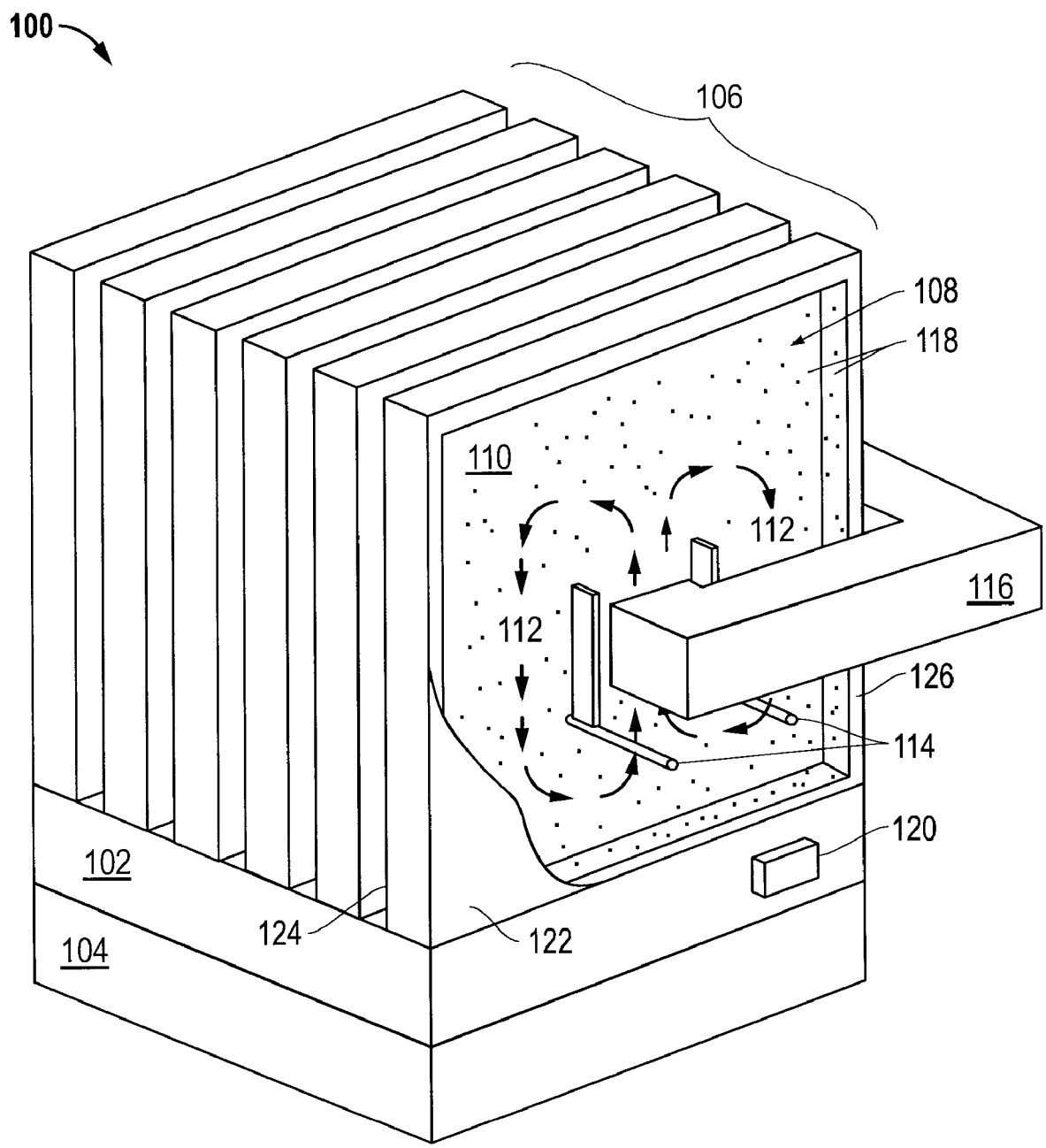
FIG. 1 sets forth a perspective view of an exemplary heat sink for dissipating a thermal load according to embodiments of the present invention.

Exemplary heat sinks for dissipating a thermal load and exemplary methods for dissipation of a thermal load according to embodiments of the present invention are described with reference to the accompanying drawings, beginning with FIG. 1. FIG. 1 sets forth a perspective view of an exemplary heat sink (100) for dissipating a thermal load according to embodiments of the present invention. The thermal load is the thermal energy generated by a thermal source (104) such as, for example, a computer processor or memory chip. A measure of thermal load is typically expressed in units of Joules. The rate at which a thermal source produces a thermal load over time is typically expressed in units of Watts.

In the example of FIG. 1, the heat sink (100) is a thermal conductor configured to absorb and dissipate the thermal load from the thermal source (104) thermally connected with the heat sink (100). Thermal conductors used in designing the heat sink (100) may include, for example, aluminum, copper, silver, aluminum silicon carbide, or carbon-based composites. The heat sink (100) of FIG. 1 absorbs the thermal load from the thermal source (104) using thermal conduction. When thermally connected to the thermal source (104), the heat sink (100) provides additional thermal mass, cooler than the thermal source (104), into which the thermal load may flow. After absorbing the thermal load, the heat sink (100)

dissipates the thermal load through thermal convection and thermal radiation into the air surrounding the heat sink (100). Increasing the surface area of the heat sink (100) typically increases the rate of dissipating the thermal load. The surface area of the heat sink (100) may be increased by enlarging a base of the heat sink, increasing the number of heat-dissipating fins, or increasing the height of the heat-dissipating fins.

The exemplary heat sink (100) of FIG. 1 includes a heat sink base (102). The heat sink base (102) is a thermal conductor capable of receiving a thermal load from a thermal source (104). The heat sink base (102) receives the thermal load from the thermal source (104) using thermal conduction and helps even out the distribution of the thermal load across a larger thermal mass region. Helping to even out the distribution is advantageous because the thermal source (104) typically distributes the thermal load unevenly along the surface of the thermal source (104) connected to the heat sink base (102).

The heat sink base (102) in the exemplary heat sink (100) of FIG. 1 typically connects to the thermal source (104) by a thermal interface. The thermal interface is a thermally conductive material that reduces the thermal resistance associated with transferring the thermal load from the thermal source (104) to the heat sink base (102). The thermal interface between the thermal source (104) and the heat sink base (102) has less thermal resistance than could typically be produced by connecting the thermal source (104) directly to the heat sink base (102). Decreasing the thermal resistance between the thermal source (104) and the heat sink base (102) increases the efficiency of transferring the thermal load from the thermal source (104) to the heat sink (100). The thermal interface may include non-adhesive materials such as, for example, thermal greases, phase change materials, and gap-filling pads. The thermal interface may also include adhesive materials such as, for example, thermosetting liquids, pressure-sensitive adhesive ('PSA') tapes, and thermoplastic or thermosetting bonding films.

The exemplary heat sink (100) of FIG. 1 also includes heat-dissipating fins (106) mounted on the heat sink base (102). Each heat-dissipating fin (106) of FIG. 1 encloses a hollowed cavity (108) inside the heat-dissipating fin (106). In the example of FIG. 1, each heat-dissipating fin (106) is a thermal conductor comprising two sheets that for two heat-conducting fin walls (122, 124) separated by spacer (126). The spacer (126) and walls (122, 124) of each fin (106) form the hollowed cavity (108) enclosed inside each heat-dissipating fin (106). The hollowed cavity (108) is a region inside each fin (106) capable of containing a thermal transport. The hollowed cavity (108) provides a convective heat path (112) for distributing the thermal load throughout each fin (106). In the exemplary heat sink (100) of FIG. 1, at least a portion of each hollowed cavity (108) extends toward the end of the heat-dissipating fin (106) opposite the heat sink base (102). Typically the end of each heat-dissipating fin (106) opposite the heat sink base (102) is the region of the heat sink with the lowest temperature. Extending at least a portion of the hollowed cavity (108) to the end of each heat-dissipating fin (106) opposite the heat sink base (102), therefore, lowers the effective thermal resistance of the exemplary heat sink (100) because such a configuration allows a thermal transport to pass through the coolest region of the heat sink (100).

Readers will note that the pattern of the hollowed cavity (108) formed by the spacer (126) that is depicted in the exemplary heat sink (100) of FIG. 1 is not a requirement or limitation of the present invention. In fact, other patterns for the hollowed cavity (108) as will occur to those of skill in the art may also be useful in a heat sink for dissipating a thermal load according to embodiments of the present invention. Moreover, there is no requirement that all the hollowed cavities of the fins (106) form the same pattern. In some embodiments of the present invention, the pattern for the hollowed cavity may be different because of the height of the individual fins, the distribution of the thermal load throughout the heat sink base, and so on. In other embodiments of the present invention, each hollowed fin cavity of the fins (106) may have a unique pattern to optimize the dissipation of a thermal load into the environment surrounding the heat sink.

The exemplary heat sink (100) of FIG. 1 includes a thermal transport (110) within the hollowed cavity (108) of each heat-dissipating fin (106). The thermal transport (110) is a thermally and electrically conductive fluid. The thermal transport (110) of FIG. 1 is capable of convectively transferring the thermal load along a convective heat path (112) within each heat-dissipating fin (106). In the example of FIG. 1, the thermal transport (110) is implemented as liquid metal such as, for example, a liquid alloy of gallium and sodium.

Using the thermal transport, the exemplary heat sink (100) of FIG. 1 provides two heat transfer paths to transfer the thermal load to the surface of the fins (106) for heat-dissipation—a conductive heat path and a convective heat path (112). The conductive heat path is the path through solid portions of the exemplary heat sink (100) through which the thermal load is transferred by heat conduction. The convective heat path (112) is the path through a liquid portion of the exemplary heat sink (100) that carries the thermal load from the end of the heat-dissipating fins (106) adjacent to the base (102) to the end of the heat-dissipating fins (106) opposite that base (102).

To move the thermal transport along the convective heat path (112), the exemplary heat sink (100) of FIG. 1 includes a pair of electrodes (114) inside each heat-dissipating fin (106). The pair of electrodes (114) of FIG. 1 are electrically connected to the thermal transport (110) within each heat-dissipating fin (106) for generating an electric current through the thermal transport (110). To generate an electric current, the pair of electrodes (114) is connected to a voltage source (not shown) that provides a voltage differential between each electrode included in the pair. The voltage differential induces an electric current through the thermal transport (110) between the electrodes. Inside each fin (106) of FIG. 1, a rectangular portion of the electrodes (114) extends through the hollowed cavity (108) to widen the area across which the electric current generated inside each heat-dissipating fin (106). In the example of FIG. 1, the electrodes (114) extend through each heat-dissipating fin (106). Readers will note that such an embodiment is for explanation and not for limitation. In fact, a separate pair of electrodes (114) may be utilized for each fin in a heat sink for dissipating a thermal load according to embodiments of the present invention.

The exemplary heat sink (100) of FIG. 1 also includes a magnet (116) mounted adjacent to the heat-dissipating fins (106) for generating a magnetic field (202) through the thermal transport (110) within each heat-dissipating fin (106). A magnet is any object that has a magnetic field. A magnet may be implemented as a permanent magnet or an electromagnet. Permanent magnets do not rely upon outside influences to generate their magnetic field. Permanent magnets occur naturally in some rocks, but may also be manufactured. Electromagnets rely upon electric current to generate a magnetic field. When the current increases, the magnetic field also increases. In the exemplary heat sink (100), the magnet (116) is implemented as an electromagnet.

In the example of FIG. 1, the magnetic field passes through the electric current and is oriented to induce a force on the thermal transport along the convective heat path (112). The force induced by the electric current and the magnetic field is often referred to as a 'Lorentz force,' which is the force exerted on a charged particle in an electromagnetic field. Such a particle will experience a force due to electric current and the magnetic field according to the following equation:

$$F = q \cdot (v \times B),$$

where, F is the force in Newtons, B is the magnetic field in Webers per square meter, q is the electric charge of the particle in Coulombs, v is the instantaneous velocity of the particle in meters per second, and × is the cross product.

Because the force induced on the thermal transport (110) results from a combination of the electric current and the magnetic field, varying the strength of either of these fields varies the intensity of the resulting force. To control the intensity of the force exerted on the thermal transport, the exemplary heat sink (100) of FIG. 1 includes a force governor (120). The force governor (120) is computer hardware capable of measuring the thermal load from the thermal source (104), measuring the thermal load from the heat sink base (102), measuring the thermal load from a heat-dissipating fin (106), and adjusting (410) the force on the thermal transport (110) within the heat-dissipating fin independence upon the measured thermal load. The force governor (120) may be implemented as a thermistor along with circuit logic to vary the voltage differential applied to the pair of electrodes (114) or to vary the current in the electromagnet (116). Such an implementation, however, is for explanation and not for limitation. In fact, the pump governor (172) may also be implemented using a more sophisticated Application Specific Integrated Circuit ('ASIC').

The intensity of the force induced on the thermal transport (110) also may be increased by increasing the intensity of the magnetic field passing through the electric current. The intensity of the magnetic field passing through the electric current may be increased by including ferromagnetic material (not shown) between each of the heat-dissipating fins (106). Including ferromagnetic material between each of the fins (106) reduces the magnetic reluctance between each of the heat-dissipating fins (106) and increases the intensity of the magnetic field passing through the electric current inside each heat-dissipating fin (106).

As mentioned above, the heat sink (100) is typically designed from materials that are electrical conductors and the thermal transport (110) within the hollowed cavity (108) of each heat-dissipating fin (106) is also an electrical conductor. To isolate the electric charges of the thermal transport (110) from other electrical charges, the exemplary heat sink (100) of FIG. 1 also includes a dielectric liner (118) along a surface of the hollowed cavity (108) inside each heat-dissipating fin (106) to insulate the thermal transport (110) from each heat-dissipating fin (106). An example of a dielectric liner (118) useful for a heat sink for dissipating a thermal load according to embodiments of the present invention includes Polytetrafluoroethylene ('PTFE'). In addition to the insulating properties of a dielectric liner (118), using a dielectric liner (118), such as, for example, PTFE, also provides the added advantage of adding a smooth surface along the hollowed cavity (108) that has a low coefficient of friction and is extremely non-reactive.

In the exemplary heat sink (100) of FIG. 1, the force induced along the convective heat path (112) transfers the thermal load in the thermal transport (110) from the end of the heat-dissipating fins (106) adjacent to the base (102) to the end of the fins (106) opposite the base (102). To direct the flow of the thermal transport along the convective heat path (112), a heat sink according to embodiments of the present invention may also include baffles. For further explanation, therefore, FIG. 2 sets forth a cross-sectional view of a further exemplary heat sink (100) for dissipating a thermal load according to embodiments of the present invention that includes baffles (210) mounted within each hollowed cavity (108). The baffles (210) of FIG. 2 may be implemented as spacers between the two thermally conducting sheets making up the fin walls for each heat-dissipating fin (106).

Figure 2:
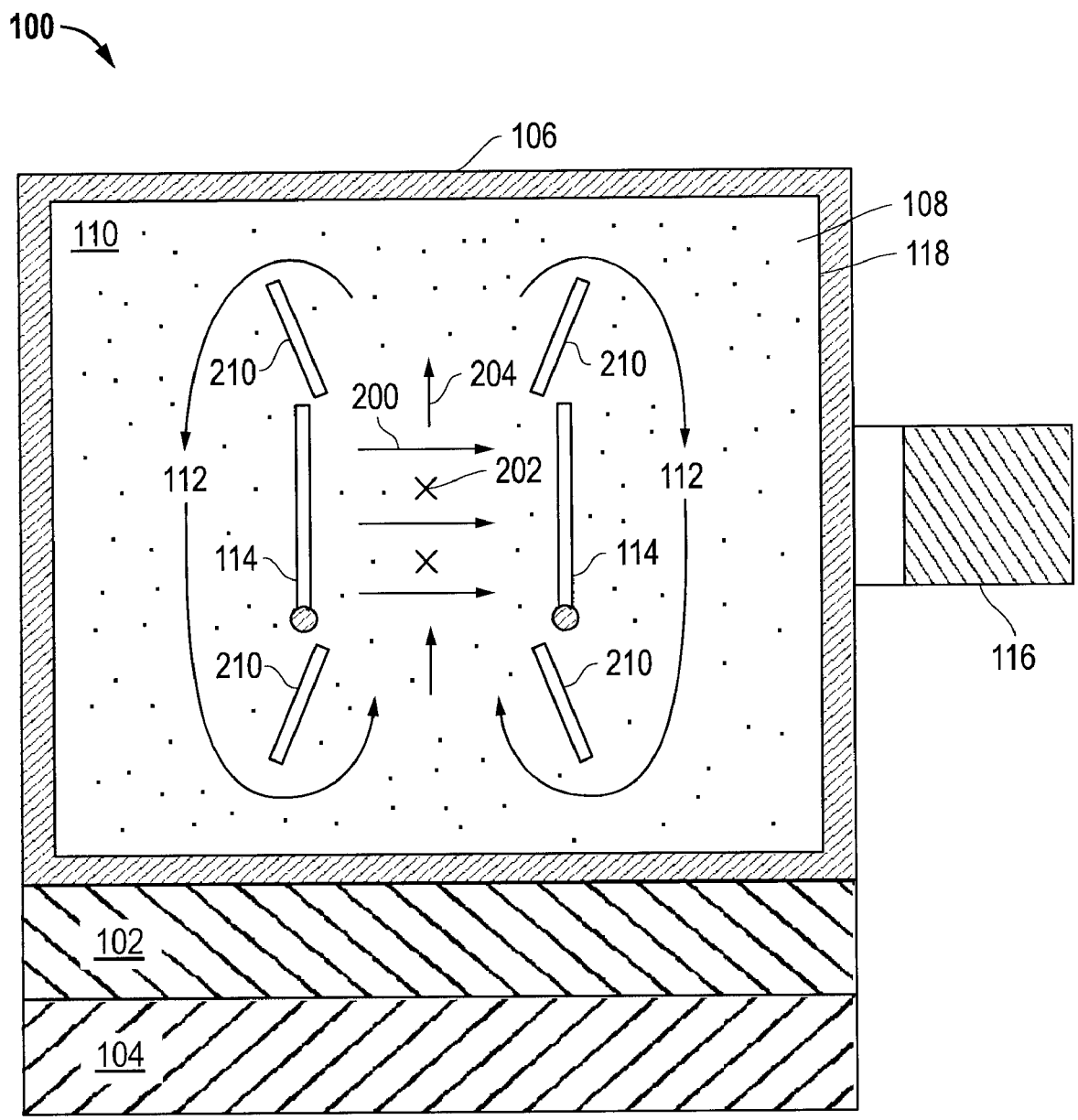
FIG. 2 sets forth a cross-sectional view of a further exemplary heat sink for dissipating a thermal load according to embodiments of the present invention.

In the exemplary heat sink (100) of FIG. 2, the baffles (210) direct the convective transfer of the thermal transport (110) along the convective heat path (112). The baffles (210) of FIG. 2 are oriented in a pattern that directs the flow of the thermal transport (110) from the end of the heat-dissipating fins (106) adjacent to the base (102) to the end of the fins (106) opposite the base (102). Readers will note that the pattern for the baffles (210) that are depicted in the exemplary heat sink (100) of FIG. 2 is not a requirement or limitation of the present invention. In fact, other patterns for baffles (210) as will occur to those of skill in the art may also be useful in a heat sink for dissipating a thermal load according to embodiments of the present invention. Moreover, there is no requirement that all the baffles of the fins (106) form the same pattern. In some embodiments of the present invention, the pattern for the baffles may be different because of the height of the individual fins, the distribution of the thermal load throughout the heat sink base, and so on. In other embodiments of the present invention, the baffles for each fin (106) may have a unique pattern to optimize the dissipation of a thermal load into the environment surrounding the heat sink.

The remaining features of the exemplary heat sink (100) of FIG. 2 are similar to the exemplary heat sink (100) of FIG. 1. The exemplary heat sink (100) of FIG. 2 includes a heat sink base (102) capable of receiving a thermal load from a thermal source (104). The heat sink (100) of FIG. 2 also includes heat-dissipating fins (106) mounted on the heat sink base (102). Each heat-dissipating fin (106) encloses a hollowed cavity (108) inside the heat-dissipating fin (106). The heat sink (100) of FIG. 2 includes a thermal transport (110) within the hollowed cavity (108) of each heat-dissipating fin (106). The thermal transport (110) is capable of convectively transferring the thermal load along a convective heat path (112) within each heat-dissipating fin (106). In the example of FIG. 2, the thermal transport (110) is implemented as liquid metal such as, for example, a liquid alloy of gallium and sodium.

To move the thermal transport along the convective heat path (112), the exemplary heat sink (100) of FIG. 2 includes a pair of electrodes (114) inside each heat-dissipating fin (106). The pair of electrodes (114) electrically connects to the thermal transport (110) within each heat-dissipating fin (106) for generating an electric current (200) through the thermal transport (110). The electric current is depicted in the example of FIG. 2 as the set of arrows (200) representing electric current vectors directed from the left of FIG. 2 to the right of FIG. 2 between the pair of electrodes (114). The heat sink (100) of FIG. 2 also includes a magnet (116) mounted adjacent to the heat-dissipating fins (106) for generating a magnetic field (202) through the thermal transport (110) within each heat-dissipating fin (106). The magnetic field is depicted in the example of FIG. 2 as pair of 'X's (202) that represent a magnetic field vectors pointing into the FIG. 2. The magnetic field (202) passes through the electric current and oriented to induce a force (204) on the thermal transport along the convective heat path (112). The force induced by the electric current (200) and the magnetic field (202) is depicted in the example of FIG. 2 as the set of arrows (204) representing force vectors directed from the bottom of FIG. 2 to the top of FIG. 2 between the pair of electrodes (114). In the exemplary heat sink (100), the magnet (116) is implemented as an electromagnet.

As mentioned above, the thermal transport (110) of FIG. 2 is an electrical conductor. The electrical charges on the thermal transport (110) typically need to be isolated from the electrical charges on the other components of the heat sink (100) or the environment around the heat sink (100). To isolate the electric charges of the thermal transport (110) from other electrical charges, the exemplary heat sink (100) of FIG. 2 also includes a dielectric liner (118) along a surface of the hollowed cavity (108) inside each heat-dissipating fin (106) to insulate the thermal transport (110) from each heat-dissipating fin (106).

FIGS. 1 and 2 illustrate an exemplary heat sink for dissipating a thermal load according to embodiments of the present invention using internal views. For further explanation using only an external view of the heat sink, FIG. 3 sets forth a perspective view of a further exemplary heat sink for dissipating a thermal load according to embodiments of the present invention.

Figure 3:
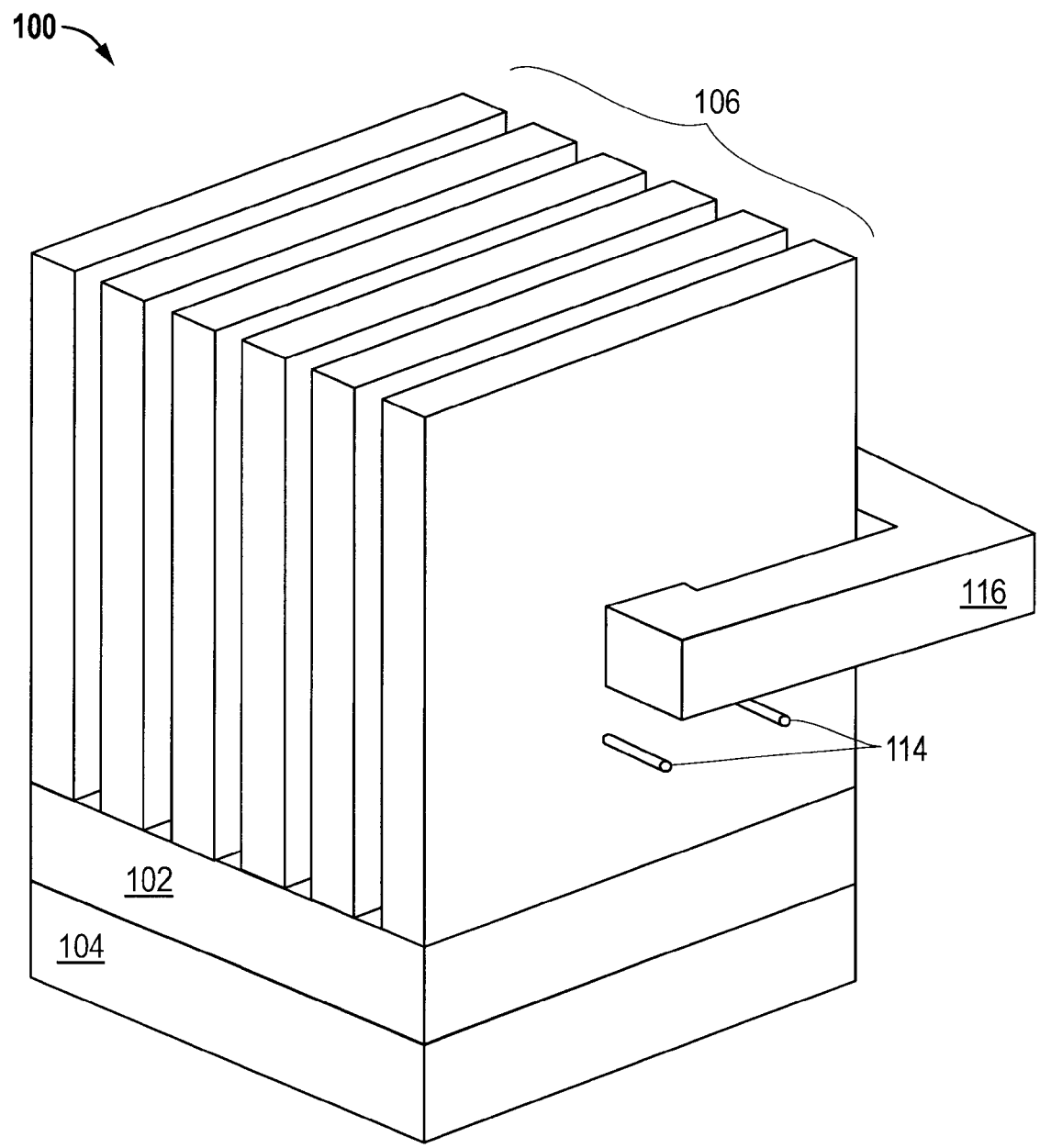
FIG. 3 sets forth a perspective view of a further exemplary heat sink for dissipating a thermal load according to embodiments of the present invention.

The exemplary heat sink (100) of FIG. 3 includes a heat sink base (102) capable of receiving a thermal load from a thermal source (104). The heat sink (100) of FIG. 3 also includes heat-dissipating fins (106) mounted on the heat sink base (102). Each heat-dissipating fin (106) encloses a hollowed cavity inside the heat-dissipating fin (106). The heat sink (100) includes a thermal transport within the hollowed cavity of each heat-dissipating fin (106). The thermal transport is capable of convectively transferring the thermal load along a convective heat path within each heat-dissipating fin (106).

The exemplary heat sink (100) of FIG. 3 also includes a pair of electrodes inside each heat-dissipating fin (106). The pair of electrodes (114) electrically connected to the thermal transport within each heat-dissipating fin for generating an electric current through the thermal transport. Also included in the exemplary heat sink (100) of FIG. 3 is a dielectric liner along a surface of the hollowed cavity inside each heat-dissipating fin (106). The dielectric liner insulates the thermal transport from each heat-dissipating fin (106).

The heat sink (100) of FIG. 3 also includes a magnet (116) mounted adjacent to the heat-dissipating fins (106) for generating a magnetic field through the thermal transport within each heat-dissipating fin (106). The magnetic field passes through the electric current and is oriented to induce a force on the thermal transport along the convective heat path. Readers will note that the orientation of the magnetic in the example of FIG. 3 is for explanation and not for limitation. In fact, instead of passing along the back side of the fins (106) of FIG. 3, the magnet (116) may pass over the top of the fins, the front side of the fins, or may be oriented in any other was as will occur to those of skill in the art to pass a magnetic field through the electric current so as to induce a force on the thermal transport along the convective heat path.

As mentioned above, exemplary methods for dissipation of a thermal load according to embodiments of the present invention are described with reference to the accompanying drawings. For further explanation, therefore, FIG. 4 sets forth a flow chart illustrating an exemplary method for dissipation of a thermal load according to embodiments of the present invention. The method of FIG. 4 includes receiving (300), in a heat sink base, a thermal load from a thermal source. As mentioned above, a thermal load is the thermal energy generated by a thermal source such as, for example, a computer processor or memory chip.

The method of FIG. 4 also includes transferring (302) the thermal load to heat-dissipating fins mounted on the heat sink base through a conductive heat path. The conductive heat path is the path through solid portions of the exemplary heat sink through which the thermal load is transferred by heat conduction. Transferring (302) the thermal load to heat-dissipating fins mounted on the heat sink base through a conductive heat path according to the method of FIG. 4 includes transferring (304) the thermal load into a thermal transport in a hollowed cavity enclosed within each heat-dissipating fin. The thermal transport is a thermally and electrically conductive fluid. The thermal transport in the example of FIG. 4 may be implemented as liquid metal such as, for example, a liquid alloy of gallium and sodium.

The method of FIG. 4 includes transferring (306) the thermal load along a convective heat path enclosed within each heat-dissipating fin to distribute the thermal load. The convective heat path is the path through a liquid portion of the exemplary heat sink that carries the thermal load from the end of the heat-dissipating fins adjacent to the base to the end of the heat-dissipating fins opposite that base. Transferring (306) the thermal load along a convective heat path enclosed within each heat-dissipating fin to distribute the thermal load according to the method of FIG. 4 is carried out by generating (308), by a pair of electrodes inside each heat-dissipating fin, an electric current through the thermal transport within each heat-dissipating fin and generating (310), by a magnet mounted adjacent to the heat-dissipating fins, a magnetic field through the thermal transport within each heat-dissipating fin, the magnetic field passing through the electric current and oriented to induce a force on the thermal transport along the convective heat path. In the example of FIG. 4, the magnet is implemented as an electromagnet.

The intensity of the force induced on the thermal transport may be increased by increasing the intensity of the magnetic field passing through the electric current. The intensity of the magnetic field passing through the electric current may be increased by including ferromagnetic material between each of the heat-dissipating fins. Transferring (306) the thermal load along a convective heat path enclosed within each heat-dissipating fin to distribute the thermal load according to the method of FIG. 4, therefore, includes reducing (312) magnetic reluctance between each of the heat-dissipating fins by placing ferromagnetic material between each of the heat-dissipating fins.

The rate at which the thermal transport transfers the thermal load along the convective heat path varies with the intensity of the induced force. The method of FIG. 4, therefore, includes adjusting (314) the force on the thermal transport within each heat-dissipating fin. Because the force induced on the thermal transport results from a combination of the electric current and the magnetic field, varying the strength of either the electric current or the magnetic field varies the intensity of the resulting force. Adjusting (314) the force on the thermal transport within each heat-dissipating fin according to the method of FIG. 4 is carried out by adjusting (316) the electric current generated by the pair of electrodes and adjusting (318) the magnetic field generated by the magnet.

Readers will note that dissipating a thermal load according to embodiments of the present invention may be carried out by circulating a thermal transport along a convective heat path within a heat-dissipating fin of a heat sink according to the present invention. For further explanation, FIG. 5 sets forth a flow chart illustrating a further exemplary method for dissipation of a thermal load according to embodiments of the present invention that includes circulating (402) the thermal transport along a convective heat path within the heat-dissipating fin.

Figure 5:
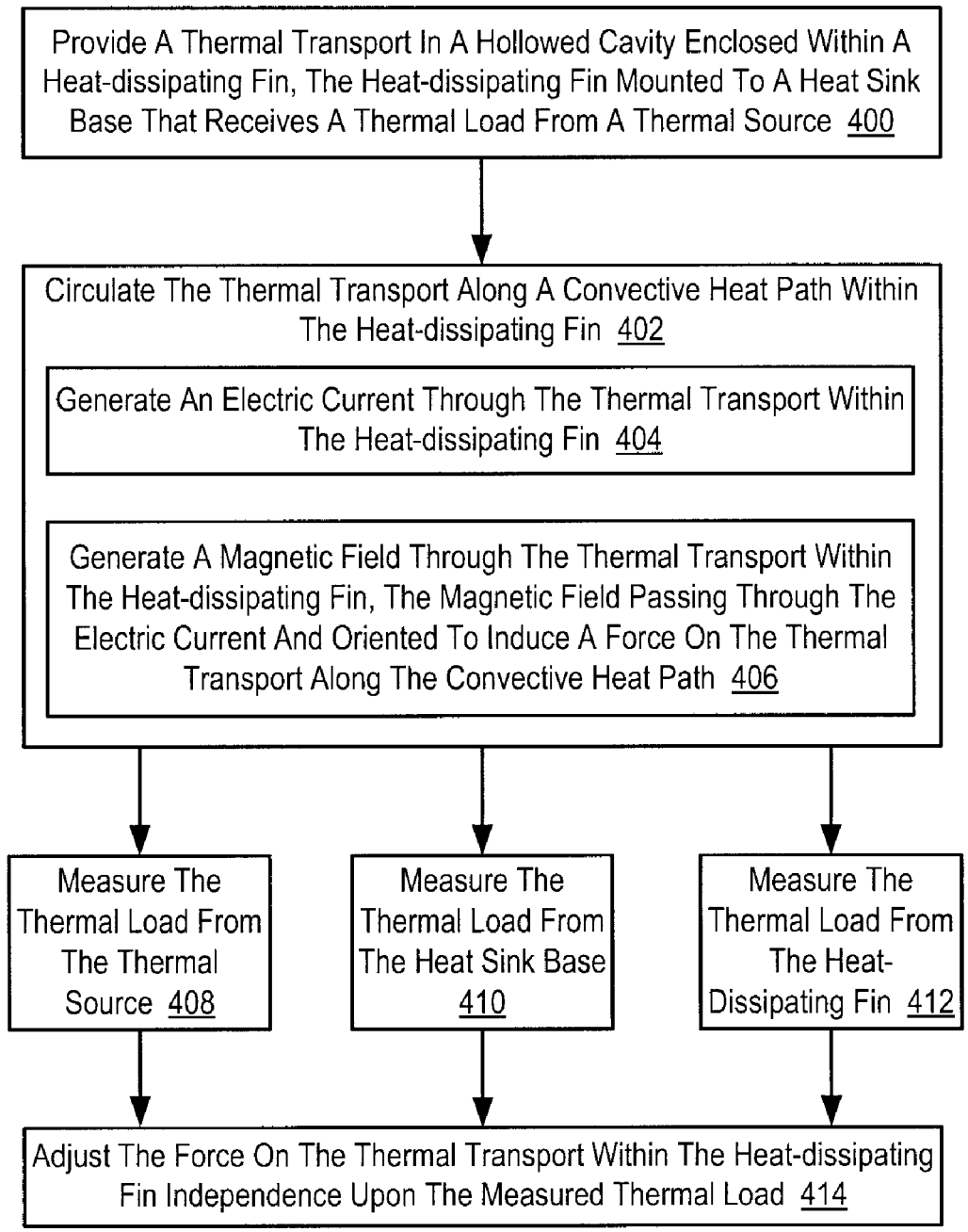
FIG. 5 sets forth a flow chart illustrating a further exemplary method for dissipation of a thermal load according to embodiments of the present invention.

The method of FIG. 5 includes providing (400) a thermal transport in a hollowed cavity enclosed within a heat-dissipating fin, the heat-dissipating fin mounted to a heat sink base that receives a thermal load from a thermal source. The thermal source, the heat sink base, the heat-dissipating fin, the hollowed cavity, and the thermal transport are similar to the thermal source, the heat sink base, the heat-dissipating fin, the hollowed cavity, and the thermal transport discussed above with reference to FIGS. 1, 2, 3, and 4.

The method of FIG. 5 also includes circulating (402) the thermal transport along a convective heat path within the heat-dissipating fin. The convective heat path is the path through a liquid portion of the heat sink that carries the thermal load from the end of the heat-dissipating fins adjacent to the base to the end of the heat-dissipating fins opposite that base. Circulating (402) the thermal transport along a convective heat path within the heat-dissipating fin is carried out by generating (404) an electric current through the thermal transport within the heat-dissipating fin, and generating (406) a magnetic field through the thermal transport within the heat-dissipating fin. The magnetic field passes through the electric current and is oriented to induce a force on the thermal transport along the convective heat path.

The rate at which the thermal transport circulates within the heat-dissipating fin typically varies with the intensity of the force induced along the convective heat path. The intensity of the force induced along the convective heat path may vary according to a variety of measurements conducted in real-time. The method of FIG. 5, therefore, includes measuring (408) the thermal load from the thermal source, measuring (410) the thermal load from the heat sink base, measuring (412) the thermal load from the heat-dissipating fin, and adjusting (414) the force on the thermal transport within the heat-dissipating fin independence upon the measured thermal loads. When adjusting (414) the force on the thermal transport within the heat-dissipating fin independence upon the measured thermal loads, adjusting (414) the force on the thermal transport according to the method of FIG. 5 may be carried out using one, two, or all three of the thermal load measurements.

In view of the explanations set forth above in this document, readers will recognize that a heat sink for dissipating a thermal load according to embodiments of the present invention provides the following benefits:
  provides more efficiency cooling by more evenly distributing the thermal load throughout the fins of a heat sink than in the current ar, and
  allows for the design of tall heat sinks that provide more surface area for heat dissipation while lowering the overall thermal resistance of the tall fins when compared to the current art.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method for dissipating a thermal load, the method comprising:
  receiving, in a heat sink base, a thermal load from a thermal source;
  transferring the thermal load to heat-dissipating fins mounted on the heat sink base through a conductive heat path, further comprising transferring the thermal load into a thermal transport in a hollowed cavity enclosed within each heat-dissipating fin; and
  transferring the thermal load along a convective heat path enclosed within each heat-dissipating fin to distribute the thermal load, further comprising generating, by a pair of electrodes inside each heat-dissipating fin, an electric current through the thermal transport within each heat-dissipating fin, and generating, by a magnet mounted adjacent to the heat-dissipating fins, a magnetic field through the thermal transport within each heat-dissipating fin, the magnetic field passing through the electric current and oriented to induce a force on the thermal transport along the convective heat path.

2. The method of claim 1 wherein the magnet is an electromagnet.

3. The method of claim 1 further comprising:
  adjusting the force on the thermal transport within each heat-dissipating fin.

4. The method of claim 3 wherein adjusting the force on the thermal transport within each heat-dissipating fin further comprises:
  adjusting the electric current generated by the pair of electrodes.

5. The method of claim 3 wherein adjusting the force on the thermal transport within each heat-dissipating fin further comprises:
  adjusting the magnetic field generated by the magnet.

6. The method of claim 1 wherein the thermal transport is liquid metal.

7. A method for dissipating a thermal load, the method comprising:
  providing a thermal transport in a hollowed cavity enclosed within a heat-dissipating fin, the heat-dissipating fin mounted to a heat sink base that receives a thermal load from a thermal source; and
  circulating the thermal transport along a convective heat path within the heat-dissipating fin, further comprising generating an electric current through the thermal transport within the heat-dissipating fin, and generating a magnetic field through the thermal transport within the heat-dissipating fin, the magnetic field passing through the electric current and oriented to induce a force on the thermal transport along the convective heat path.

8. The method of claim 7 further comprising:
  measuring the thermal load from the thermal source; and
  adjusting the force on the thermal transport within the heat-dissipating fin independence upon the measured thermal load.

9. The method of claim 7 further comprising:
  measuring the thermal load from the heat sink base; and
  adjusting the force on the thermal transport within the heat-dissipating fin independence upon the measured thermal load.

10. The method of claim 7 further comprising:
  measuring the thermal load from the heat-dissipating fin; and
  adjusting the force on the thermal transport within the heat-dissipating fin independence upon the measured thermal load.

* * * * *